(12) United States Patent
Borgioli et al.

(10) Patent No.: US 12,399,197 B2
(45) Date of Patent: Aug. 26, 2025

(54) CLOSED LOOP, HIGH ACCURACY HALL EFFECT SENSOR AFE WITH AUTOZEROED SWITCHED-CAPACITOR ANALOG ACCUMULATOR

(71) Applicant: STMicroelectronics International N.V., Geneva (CH)

(72) Inventors: Francesco Borgioli, Leghorn (IT); Roberto Pio Baorda, Casarile (IT); Paolo Angelini, Bologna (IT); Danilo Karim Kaddouri, Pero (IT); Lorenzo Ercolini, Milan (IT)

(73) Assignee: STMicroelectronics International N.V., Geneva (CH)

( * ) Notice: Subject to any disclaimer, the term of this patent is extended or adjusted under 35 U.S.C. 154(b) by 86 days.

(21) Appl. No.: 18/367,044

(22) Filed: Sep. 12, 2023

(65) Prior Publication Data
US 2025/0085314 A1    Mar. 13, 2025

(51) Int. Cl.
*G01R 15/20*    (2006.01)
*G01R 19/10*    (2006.01)

(52) U.S. Cl.
CPC .......... *G01R 15/202* (2013.01); *G01R 19/10* (2013.01)

(58) Field of Classification Search
CPC .... G01R 15/202; G01R 19/10; G01R 15/205; G01R 15/207; G01R 15/20; G01R 19/08; G01R 19/06; G01R 19/04; G01R 19/02; G01R 19/0092; G01R 19/12; G01R 19/145; G01R 19/15; G01R 19/003; G01R 19/0038; G01R 19/0023; G01R 19/0007; G01R 19/0015; G01R 19/30
See application file for complete search history.

(56) References Cited

U.S. PATENT DOCUMENTS

| | | |
|---|---|---|
| 7,746,065 B2 | 6/2010 | Pastre et al. |
| 9,404,991 B2 | 8/2016 | Anelli et al. |
| 9,810,759 B2 | 11/2017 | Polley et al. |
| 10,698,066 B2 | 6/2020 | Polley et al. |

(Continued)

OTHER PUBLICATIONS

Pastre, Marc, et al.: "A Hall Sensor Analog Front End for Current Measurement With Continuous Gain Calibration," IEEE Sensors Journal, vol. 7, No. 5, May 2007, 8 pgs.

(Continued)

*Primary Examiner* — Alvaro E Fortich
(74) *Attorney, Agent, or Firm* — Crowe & Dunlevy LLC

(57) ABSTRACT

Disclosed herein is a system for measuring current, including an input inductor and a self-test inductor through which respective input and self-test currents flow. A Hall-effect sensor circuit senses magnetic fields around these inductors, producing differential voltage outputs. These outputs are received by an input and self-test extraction circuit, which alternatingly outputs differential voltages representative of the magnetic fields around the inductors. Amplification of these differential voltages is performed by an amplifier. Sampling of the amplified differential voltages is performed by two sample/hold circuits, each designated for a specific inductor's magnetic field. An integrator circuit adjusts a voltage for the Hall effect sensor circuit, causing the gain applied to the sampled differential voltage to remain consistent and uninfluenced by the sensitivity of the Hall effect sensor circuit.

22 Claims, 4 Drawing Sheets

(56) References Cited

U.S. PATENT DOCUMENTS

| | | | |
|---|---|---|---|
| 11,307,267 B1 | 4/2022 | Polley et al. | |
| 2015/0070007 A1* | 3/2015 | Kurniawan | G01R 35/00 |
| | | | 324/251 |
| 2017/0248662 A1* | 8/2017 | Santos | G01R 33/0029 |
| 2019/0317175 A1* | 10/2019 | Polley | G01R 33/0035 |
| 2020/0348372 A1* | 11/2020 | Yalamarthy | G01R 33/07 |
| 2020/0366079 A1* | 11/2020 | Telefus | H02J 13/00022 |

OTHER PUBLICATIONS

Motz, Mario, et al.: "A Miniature Digital Current Sensor With Differential Hall Probes Using Enhanced Chopping Techniques and Mechanical Stress Compensation," Infineon Technologies Austria AG, Villach, Austria, 2012 IEEE, 4 pgs.

Randjelovic, Zoran B., et al.: "Highly Sensitive Hall Magnetic Sensor Microsystem in CMOS Technology," IEEE Journal of Solid-State Circuits, vol. 37, No. 2, Feb. 2002, 10 pgs.

Mo, Shaoqing, et al.: "A Multiple-Sensitivity Hall Sensor Featuring a Low-Cost Temperature Compensation Circuit," Microelectronics Journal 113 (2021) 105067, 7 pgs.

\* cited by examiner

CLOSED LOOP, HIGH ACCURACY HALL EFFECT SENSOR AFE WITH AUTOZEROED SWITCHED-CAPACITOR ANALOG ACCUMULATOR

TECHNICAL FIELD

This disclosure is directed to an analog front end for sensing current through a Hall effect sensor. The analog front end is able to compensate the sensitivity of the Hall effect sensor for variation due to temperature and stress.

BACKGROUND

A Hall effect sensor is a transducer that responds to a magnetic field by varying its output voltage. This sensor operates by energizing a thin strip of conductive material with an electrical current. When subjected to a magnetic field perpendicular to the direction of the current flow, the magnetic field deflects the path of the charge carriers to one side of the material. This deflection leads to a voltage difference across the strip's opposite edges, referred to in the art as the Hall voltage, which is directly proportional to the strength of the magnetic field. This voltage is then measured, amplified, and output in either analog or digital form.

Hall effect sensors may present variability in their sensitivity, which can result in inconsistencies and inaccuracies in their output. The causes of this variability could include temperature changes, manufacturing variances, aging, and supply voltage instability. Given this, compensation techniques have been developed.

For example, temperature and stress on the sensor may be measured and digitized, and then the sensitivity of the sensor may be compensated in an open loop fashion through a digital signal processor; however, the efficiency of the compensation is dependent on the accuracy of the measures of temperature and stress, and such accuracy may be dubious. As another example, an analog front-end with continuous gain calibration biased in current is utilized, necessitating a complex and space consuming design that includes two high-accuracy analog to digital converters (ADCs) and a digital to analog converter (DAC). The digital feedback utilized for gain and offset correction can lead to accuracy challenges. Furthermore, the separation of signal, offset, and reference via frequency domain modulation and demodulation utilized with such approaches results in a trade-off between reference amplitude and system output dynamics, and can cause accuracy problems especially with non-linear or high bandwidth input signals.

Further development is needed to overcome these challenges.

SUMMARY

Disclosed herein is a system for measuring current. The system incorporates an input inductor for input current and a self-test inductor for self-test current. Magnetic fields generated around these inductors are sensed by a Hall effect sensor circuit, which produces differential voltage outputs.

The sensor circuit incorporates four Hall effect sensors. These sensors differ in their physical orientation, allowing them to be responsive to varying magnetic field orientations of both the input and self-test inductors. Furthermore, these sensors also respond to earth's magnetic field in distinct directions, namely into and out of the plane.

An input and self-test extraction circuit is coupled to receive these voltage outputs from the Hall effect sensor circuit. This circuit alternates its outputs, providing a differential voltage indicating magnetic fields around either the input inductor or the self-test inductor based on the combination of outputs from the four Hall effect sensors.

An amplifier amplifies these differential voltages. Two sample/hold circuits then sample these amplified differential voltages. The first sample/hold circuit samples when the differential voltage indicates the magnetic field around the self-test inductor, while the second does so for the input inductor.

An integrator circuit adjusts a voltage to the power supply inputs of the Hall effect sensor circuit. The adjustment is based on an error determination between the sampled differential voltage of the first sample/hold circuit and a given reference differential voltage. This provides that the gain applied to the sampled differential voltage of the second sample/hold circuit remains unaffected by the Hall effect sensor circuit's sensitivity.

A low-pass filter filters the differential voltage from the second sample/hold circuit, with its output voltage determined by a specific proportion formula. Moreover, signal and reference accumulators are integrated to accumulate the sampled voltages indicating magnetic fields around the input and self-test inductors, respectively. Both accumulators have specific configurations involving amplifiers, capacitors, and switches that function in designated reset and accumulation phases to gather and process the voltage data.

Also disclosed herein is a method for measuring a current. This method involves passing an input current through an input inductor and a self-test current through a self-test inductor. Magnetic fields around these inductors are sensed using a hall effect sensor circuit, resulting in differential voltage outputs. These outputs are received by an input and self-test extraction circuit, which alternates in outputting voltages that signify magnetic fields around either the input inductor or the self-test inductor. These voltages are amplified using an amplifier.

The amplified voltages are sampled differently based on the magnetic field they indicate. The first sample/hold circuit samples the voltage when it points to the magnetic field around the self-test inductor, while the second sample/hold circuit samples when it refers to the field around the input inductor. An integrator circuit adjusts a voltage applied to the hall effect sensor circuit's power supply inputs based on an error that is based upon the comparison between the sampled differential voltage of the first sample/hold circuit and a reference differential voltage. This adjustment orivudes tgar that the gain applied to the voltage from the second sample/hold circuit remains unaffected by any changes in the hall effect sensor circuit's sensitivity.

Additionally, the method utilizes four Hall effect sensors to detect the magnetic fields. Each sensor is differently oriented to be receptive to various orientations of the magnetic fields around the inductors and the earth's magnetic field. Outputs from these sensors are combined in specific configurations to alternately signify the magnetic fields around the self-test and input inductors. Furthermore, there are specific combinations of the outputs of these sensors to determine the magnetic fields around each inductor and to derive the differential voltages indicative of these fields.

DETAILED DESCRIPTION

The following disclosure enables a person skilled in the art to make and use the subject matter described herein. The general principles outlined in this disclosure can be applied to embodiments and applications other than those detailed above without departing from the spirit and scope of this disclosure. It is not intended to limit this disclosure to the embodiments shown, but to accord it the widest scope consistent with the principles and features disclosed or suggested herein.

Note that in the following description, any resistor or resistance mentioned is a discrete device, unless stated otherwise, and is not simply an electrical lead between two points. Therefore, any resistor or resistance connected between two points has a higher resistance than a lead between those two points, and such resistor or resistance cannot be interpreted as a lead. Similarly, any capacitor or capacitance mentioned is a discrete device, unless stated otherwise, and is not a parasitic element, unless stated otherwise. Additionally, any inductor or inductance mentioned is a discrete device, unless stated otherwise, and is not a parasitic element, unless stated otherwise.

Figure 1:
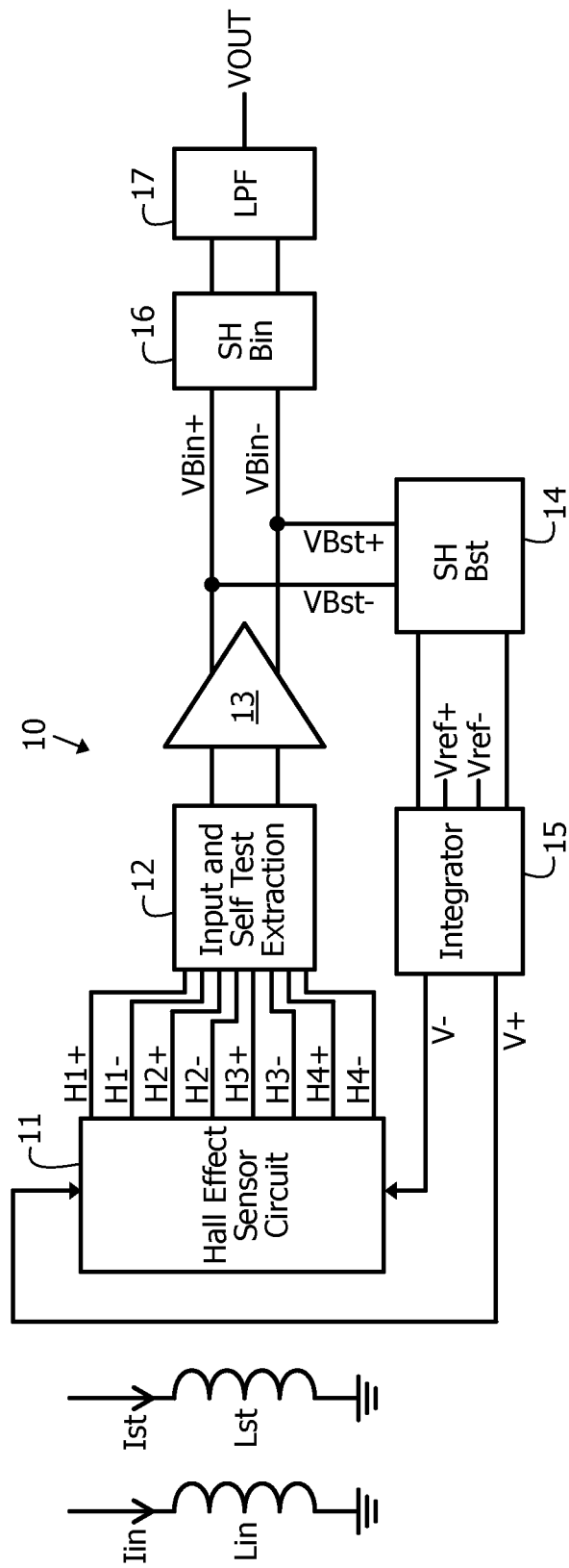
FIG. 1 is a block diagram of a first embodiment of an analog front-end for a Hall effect sensor circuit.

Now described with reference to FIG. 1 is an analog front-end 10 for a Hall effect sensor circuit 11.

An input current Iin to be measured flows through an inductor Lin, and a self-test current Ist flows through an inductor Lst. The Hall effect sensor circuit 11 produces differential voltages V+, V− based on the magnetic field B surrounding the inductors Lin and Lst.

An input and self-test extraction circuit 12 is connected to receive output from the Hall effect sensor circuit 11. As will be explained in detail below, the input and self-test extraction circuit 12 alternates its output of a differential voltage to represent either the magnetic field Bin surrounding the inductor Lin or the magnetic field Bst around the inductor Lst. This differential voltage is amplified by the amplifier 13, having a gain G. When the voltage output by the amplifier 13 represents the magnetic field Bst about the inductor Lst (the voltage in this instance being represented as VBst+, VBst−), the sample/hold circuit 14 samples and holds the amplified differential voltage; when the voltage output by the amplifier 13 represents the magnetic field Bin about the inductor Lin (the voltage in this instance being represented as VBin+, VBin−), the sample/hold circuit 16 samples and holds the amplified differential voltage.

Referring back to the case where the voltage VBst+, VBst− representing the magnetic field Bst about the inductor Lst is output by the amplifier 13 and sampled by the sample/hold circuit 14, the integrator 15 integrates this sampled voltage after subtracting a reference voltage, given as Vref+, Vref−. This integration effectively yields a differential voltage V+, V− that is proportional to the difference between the sampled voltage VBst+, VBst− and the reference voltages Vref+, Vref−. This differential voltage V+, V− is connected to the Hall effect sensor circuit 11 such that the input and output of the sample/hold circuit 14, via this feedback mechanism, match the reference voltages Vref+, Vref−. This mechanism enables calibration of the circuit 10 by compensating for the sensitivity of the Hell effect sensor circuit 11.

Stated differently, the integrator 15 produces an error voltage by subtracting Vref+, Vref− from the sampled voltage. This error voltage utilized in adjusting the Hall effect sensor circuit 11 to reach a point where the error is reduced substantially to zero, which means that the input/output of the sample/hold circuit 14 is equal to Vref+, Vref−.

As explained, when the voltage VBin+, VBin− representing the magnetic field Bin about the inductor Lin is output by the amplifier 13, the sample/hold circuit 16 samples that differential voltage. Subsequently, the sampled voltage VBin+, VBin− undergoes low-pass filtering via filter 17 to thereby produce an output voltage VOUT which is indicative of the input current Iin. As a result of the operation of the feedback loop, the output VOUT of the LPF 17 is (assuming the gain of the amplifier 13 to be unity) equal to the ratio of the voltage VBin to the voltage VBst, multiplied by the reference voltage Vref. Mathematically this is represented as:

$$VOUT = \frac{Vref}{VBst} \cdot VBin.$$

Thus, the gain to be applied the output voltage VOUT is solely that applied by the amplifier 13, independent of the sensitivity of the hall effect sensor circuit 11.

Figure 2:
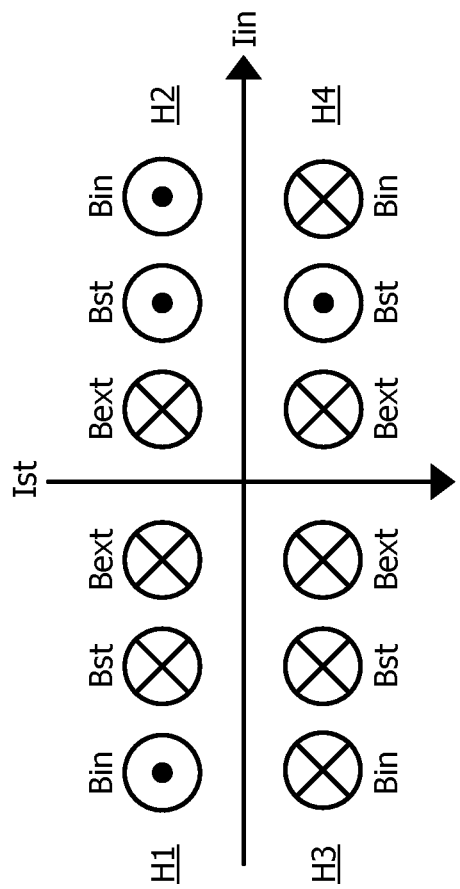
FIG. 2 is a diagram showing the relationship between the physical orientations of the individual Hall effect sensors within the Hall effect sensor circuit of FIG. 1 and the magnetic fields about the input inductor and self-test inductor, as well as the magnetic field of the Earth.

Turning now to FIG. 2, the operation of the input and self-test extraction circuit 12 is now described. The Hall effect sensor circuit 11 is comprised of four separate Hall effect sensors, labeled as H1, H2, H3 and H4. The physical placement of the individual Hall effect sensors H1-H4 provides for specific orientations relative to the magnetic fields as follows:

As seen from H1, the magnetic field Bin about the inductor Lin is directed out of the page, the magnetic field Bst about the inductor Lst is directed into the page, and the magnetic field Bext of the environment (e.g., the earth magnetic field) is directed into the page. Mathematically, this can be represented as:

$$BH1 = \text{Bin} - Bst - Bext \quad (1)$$

As seen from H2, the magnetic field Bin is directed out of the page, the magnetic field Bst is directed out of the page, and the magnetic field Bext is directed into the page. Mathematically, this can be represented as:

$$BH2 = \text{Bin} + Bst - Bext \quad (2)$$

As seen from H3, the magnetic field Bin is directed into the page, the magnetic field Bst is directed into the page, and the magnetic field Bext is directed into the page. Mathematically, this can be represented as:

$$BH3 = -\text{Bin} - Bst - Bext \quad (3)$$

As seen from H4, the magnetic field Bin is directed into the page, the magnetic field Bst is directed out of the page, and the magnetic field Bext is directed into the page. Mathematically, this can be represented as:

$$BH4 = -Bin + Bst - Bext \quad (4)$$

Equations (1), (2), (3), (4) can be combined to solve for the magnetic fields Bin and Bst and form the following two equations:

$$Bin = BH1 + BH2 - BH3 - BH4 \quad (5)$$
$$Bst = BH2 + BH4 - BH1 - BH3 \quad (6)$$

The function of the input and self-test extraction circuit 12 is therefore to interconnect the Hall effect sensors H1, H2, H3, and H4 so that the resultant output from the Hall effect sensor circuit 11 alternates between representing the magnetic field Bin of the inductor Lin and the magnetic field Bst of the inductor Lst. Each of these Hall effect sensors H1-H4 has first and second power supply inputs (connected to the outputs of integrator 15), as well as both positive and negative outputs.

In order to add the outputs of two Hall effect sensors, within the input and self-test extraction circuit 12, the positive outputs thereof are connected to one another, and the negative outputs thereof are connected to one another. Similarly, in order to subtract the output of one Hall effect sensor from another, the positive output of the first Hall effect sensor is connected to the negative output of the second Hall effect sensor, while the negative output of the first Hall effect sensor is connected to the positive output of the second Hall effect sensor.

According to this, in order for the input and self-test extraction circuit 12 to output Bin, the outputs of the Hall effect sensors H1, H2, H3, H4 are connected as described above to produce equation (5), and in order for the input and self-test extraction circuit 12 to output Bst, the outputs of the Hall effect sensors H1, H2, H3, H4 are connected as described above to produce equation (6).

This, in order for the input and self-test extraction circuit 12 to output the differential voltage VBst+, VBst– representative of the magnetic field Bst surrounding the self-test inductor Lst, the Hall effect sensors H1-H4 are connected as described above to produce equation (6), while in order for the input and self-test extraction 12 to output the differential voltage VBin+, VBin– representative of the magnetic field Bin surrounding the input inductor Lin (and thus, representative of the input current Iin), the Hall effect sensors H1-H4 are connected as decribed above to produce equation (5).

Figure 3:
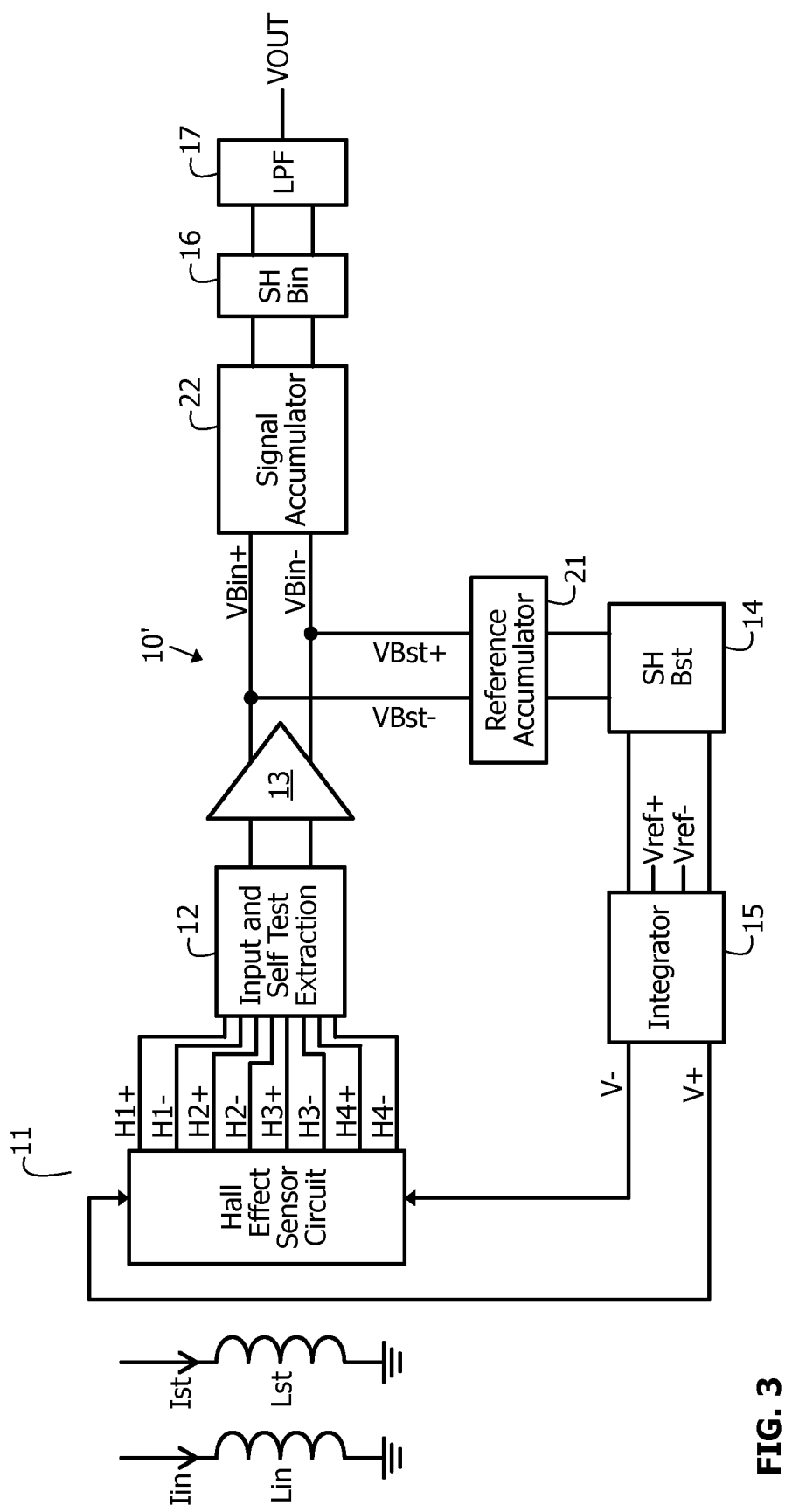
FIG. 3 is a block diagram of a second embodiment of an analog front-end for a Hall effect sensor circuit.

Another embodiment of an analog front-end 10' for a Hall effect sensor circuit 11 is now described with reference to FIG. 3. Note in this embodiment, a reference accumulator 21 is coupled between the outputs of the amplifier 13 and the inputs of the sample/hold circuit 14, and a signal accumulator 22 is coupled between the outputs of the amplifier 13 and the inputs of the sample/hold circuit 16.

Figure 4A:
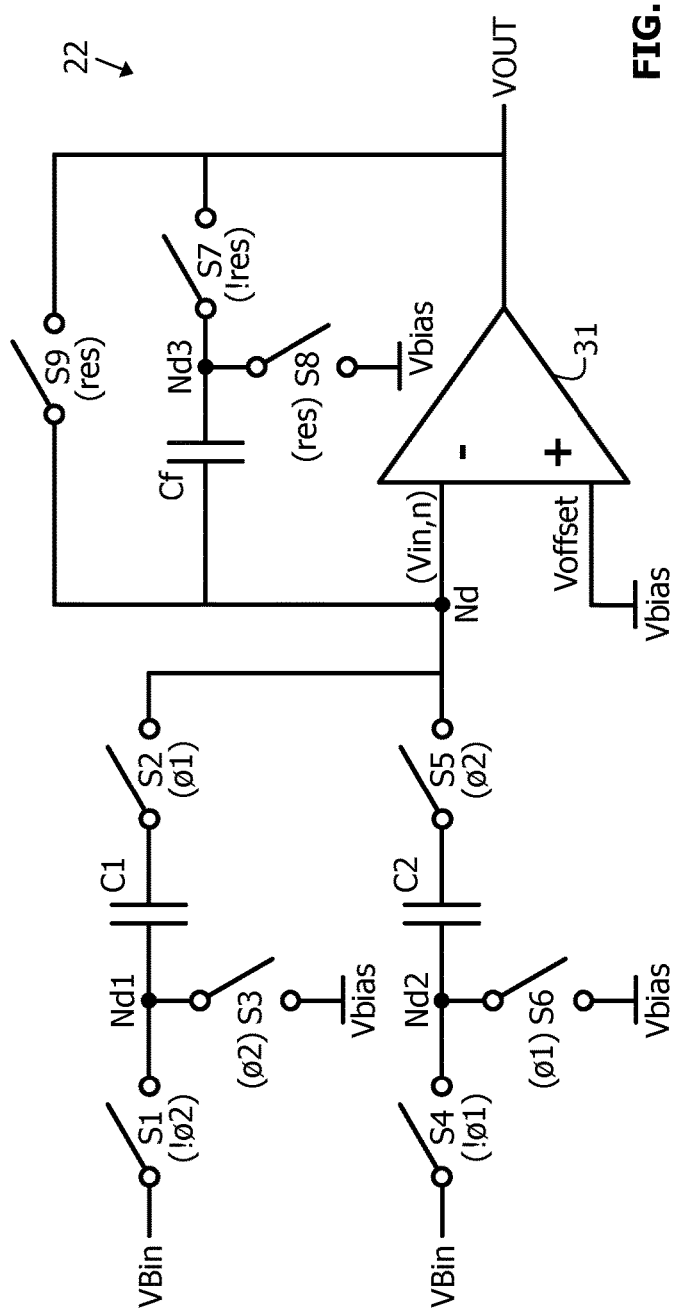
FIG. 4A is a schematic diagram of the signal accumulator of FIG. 3.

Turning now to FIG. 4A, the specific details of the signal accumulator 22 are now given, with the signal accumulator 22 being represented in single-ended form in this example, and therefore in this example, the voltage representing the magnetic field Bin about the inductor Lin is represented as VBin. The signal accumulator 22 includes an amplifier 31 having its non-inverting input connected to a bias voltage Vbias and its inverting input connected to node Nd. A switch S1 selectively couples the voltage VBin representing the magnetic field Bin about the inductor Lin to node Nd1, in response to the control signal !Ø2. A capacitor C1 is connected between node Nd1 and a first terminal of switch S2, which selectively couples capacitor C1 to node Nd in response to the control signal Ø1. A switch S3 selectively couples node Nd1 to Vbias, in response to the control signal Ø2. A switch S4 selectively couples the voltage VBin representing the magnetic field Bin about the inductor Lin to node Nd2, in response to the control signal !Ø1. A capacitor C2 is connected between node Nd2 and a first terminal of switch S5, which selectively couples capacitor C2 to node Nd in response to the control signal Ø2. A switch S6 selectively couples node Nd2 to Vbias, in response to the control signal Ø1.

A capacitor Cf is connected between nodes Nd and Nd3. A switch S7 selectively couples node Nd3 to the output of the amplifier 31, in response to the control signal !res. A switch S8 selectively couples node Nd3 to Vbias, in response to control signal res. A switch S9 selectively couples node Nd to the output of the amplifier 31, in response to the control signal res. The output voltage VOUT is produced at the output of the amplifier 31.

Figure 4B:
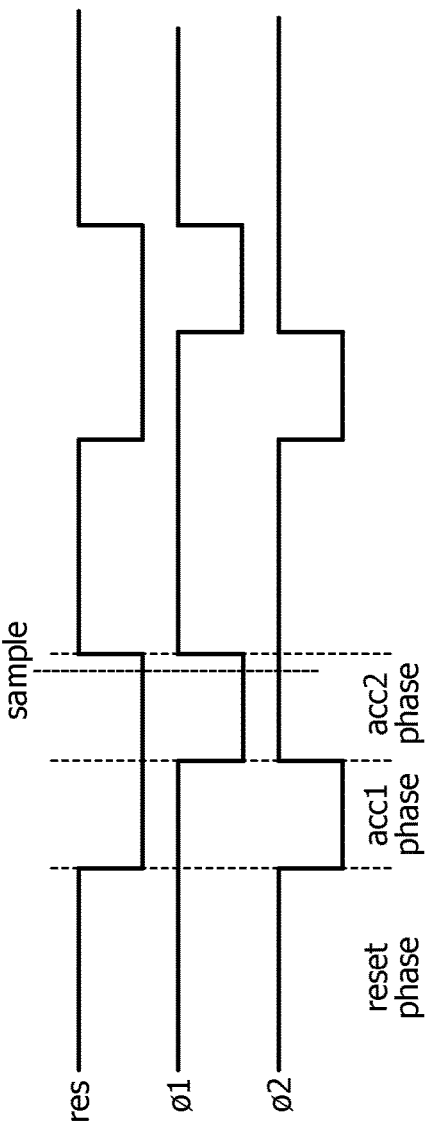
FIG. 4B is a timing diagram showing operation of the switches of the signal accumulator of FIG. 4A.

The operation of the signal accumulator 22 will now be described, with this operation serving to auto-zero the amplifier offset and remove latency resulting from sampling. Refer now to FIG. 4B, where it can be seen that operation proceeds through a reset phase, a first accumulation phase, and a second accumulation phase.

Initially, a reset phase is performed. As shown in FIG. 4B, during the reset phase, the control signal res is asserted, closing switches S8 and S9, and the control signals Ø1 and Ø2 are asserted, closing switches S2, S3, S5, and S6, with the remaining switches opened. This discharges capacitors C1, C2, and Cf, and shorts the inverting input and output of the amplifier 31 to one another.

Following the reset phase, the first accumulation phase begins. During this phase, the control signal Ø2 is deasserted (so its inverse !Ø2 is asserted), thereby closing switch S1 and passing the voltage VBin to node Nd1. Concurrently, the control signal Ø1 remains asserted (so its inverse !Ø1 is deasserted), leading to the continuation of the closure of switches S2 and S6. This results in capacitor C1 accumulating the voltage difference between VBin and Vbias via node Nd1. Since the voltage VBin as fed to switch S4 does not play a role in this first accumulation phase, switch S4 remains open, ensuring that voltage VBin is not connected to node Nd2. By the end of this first accumulation phase, the output voltage VOUT can be derived from the relationship:

$$(C1 + Cf) \cdot \textit{Voffset} = $$
$$C1 \cdot (\textit{Voffset} - \textit{Vin}, n-1) + Cf \cdot (\textit{Voffset} - \textit{VOUT}, n-1)\%$$

In this, Voffset is the offset of the amplifier 31 and Vin,n is the voltage at the inverting input of the amplifier 31.

This can be arranged to yield:

$$\textit{VOUT}, n-1 = \left(-\frac{C1}{Cf}\right) \cdot \textit{Vin}, n-1\%$$

Next, the second accumulation phase begins. During this phase, the control signal Ø1 is deasserted (so the control signal !Ø1 is asserted), closing switch S4, coupling voltage VBin to node Nd2. Concurrently, the control signal Ø2 is asserted (so the control signal !Ø2 is deasserted), closing switches S3 and S5. This results in capacitor C2 accumulating the voltage difference between VBin and the ground via node Nd2. The voltage VBin at switch S1 is not connected in this phase because switch S1 is opened due to the control signal !Ø2 being deasserted.

By the end of this second accumulation phase, the output voltage VOUT can be derived from the relationship:

$$Cf \cdot (Voffset - VOUT, n-1) + C2 \cdot Voffset =$$
$$C2 \cdot (Voffset - Vin, n) + Cf \cdot (Voffset - VOUT, n)\%$$

This can be rearranged to yield:

$$VOUT, n = \left(-\frac{C2}{Cf}\right) \cdot Vin, n + VOUT, n - 1\%$$

Substituting in the value of VOUT, n−1 from the previous phase yields:

$$VOUT, n = \left(-\frac{C1}{Cf}\right) \cdot Vin, n - 1 + \left(-\frac{C2}{Cf}\right) \cdot Vin, n\%$$

Note therefore that the result is that the offset Voffset has been canceled from VOUT through the accumulation phases.

This design for the signal accumulator 22 therefore cancels the offset inherent to switched-capacitor accumulator stages without introducing complexity. Moreover, this design eliminates the need to sample the input signal, eliminating concerns of latency and providing for immediate response times. Still further, the design avoids introducing additional components to the virtual ground of the amplifier 31. Note this design may be adapted to use a fully differential amplifier 31.

Figure 5:
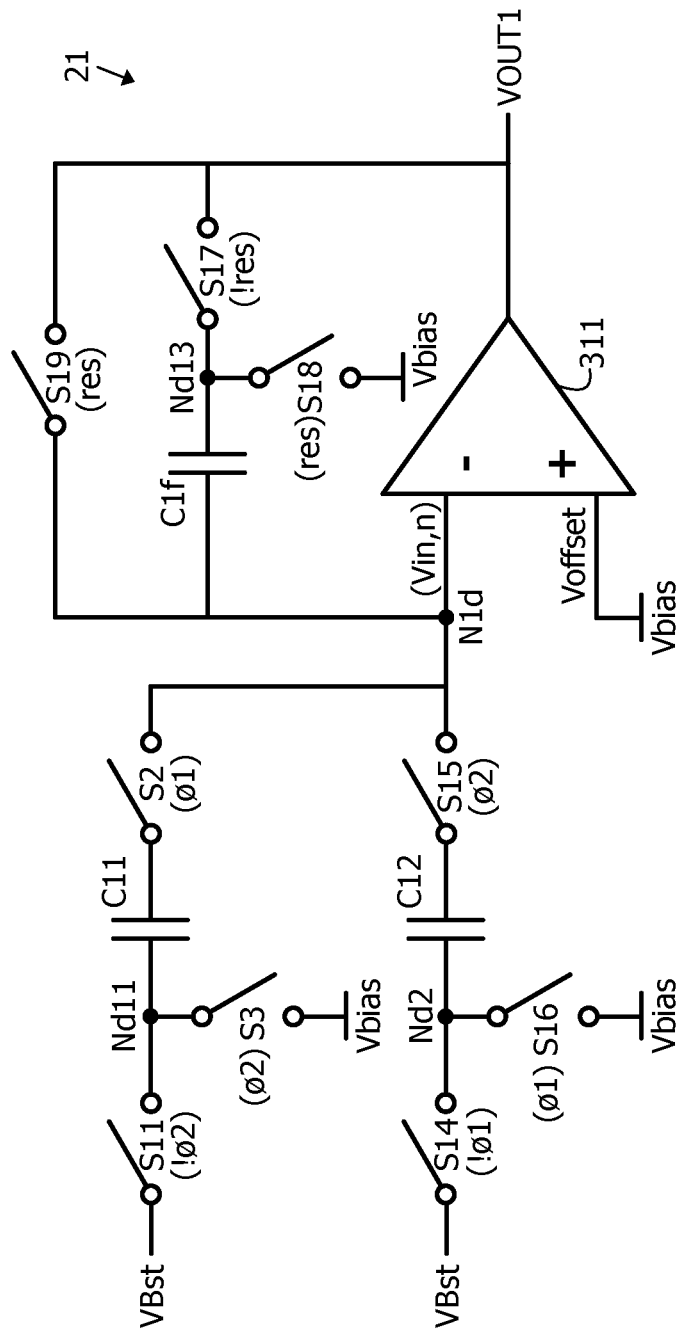
FIG. 5 is a schematic diagram of the reference accumulator of FIG. 3.

Turning now to FIG. 5, the specific details of the reference accumulator 21 are now given with the reference accumulator 21 being represented in single-ended form in this example, and therefore in this example, the voltage representing the magnetic field Bin about the inductor Lst is represented as VBst. The signal accumulator 21 includes an amplifier 311 having its non-inverting input connected to the bias voltage Vbias and its inverting input connected to node N1d. A switch S11 selectively couples the voltage VBst representing the magnetic field Bst about the inductor Lst to node Nd11, in response to the control signal !Ø2. A capacitor C11 is connected between node Nd11 and a first terminal of switch S12, which selectively couples capacitor C11 to node Nd in response to the control signal Ø1. A switch S13 selectively couples node Nd11 to Vbias, in response to the control signal Ø2. A switch S14 selectively couples the voltage VBst representing the magnetic field Bst about the inductor Lst to node Nd12, in response to the control signal !Ø1. A capacitor C12 is connected between node Nd12 and a first terminal of switch S15, which selectively couples capacitor C12 to node N1d in response to the control signal Ø2. A switch S16 selectively couples node Nd12 to Vbias, in response to the control signal Ø1.

A capacitor C1f is connected between nodes N1d and Nd13. A switch S17 selectively couples node Nd13 to the output of the amplifier 311, in response to the control signal !res. A switch S18 selectively couples node Nd13 to Vbias, in response to control signal res. A switch S19 selectively couples node N1d to the output of the amplifier 311, in response to the control signal res. The output voltage VOUT1 is produced at the output of the amplifier 311.

Operation of the reference accumulator 21 is the same as the signal accumulator 22, with this operation serving to auto-zero the amplifier offset and remove latency resulting from sampling. Refer back to FIG. 4B, where it can be seen that operation proceeds through a reset phase, a first accumulation phase, and a second accumulation phase.

During the reset phase, the control signal res is asserted, closing switches S18 and S19, and the control signals Ø1 and Ø2 are asserted, closing switches S12, S13, S15, and S16, with the remaining switches opened. This discharges capacitors C11, C12, and C1f, and shorts the inverting input and output of the amplifier 311 to one another.

Following the reset phase, the first accumulation phase begins. During this phase, the control signal Ø2 is deasserted (so its inverse !Ø2 is asserted), thereby closing switch S11 and directing the voltage VBst to node Nd11. Concurrently, the control signal Ø1 remains asserted (so its inverse !Ø1 is deasserted), leading to the continuation of the closure of switches S12 and S16. This results in capacitor C11 accumulating the voltage difference between VBst and Vbias via node Nd11. Since the voltage VBst at switch S14 does not play a role in this first accumulation phase, switch S14 remains open, ensuring that voltage VBst is not connected to node Nd12. By the end of this first accumulation phase, the output voltage VOUT1 can be derived from the relationship:

$$(C1 + Cf) \cdot Voffset =$$
$$C1 \cdot (Voffset - Vin, n-1) + Cf \cdot (Voffset - VOUT1, n-1)\%$$

In this, Voffset is the offset of the amplifier 311 and Vin,n is the voltage at the inverting input of the amplifier 311.

This can be arranged to yield:

$$VOUT1, n-1 = \left(-\frac{C1}{Cf}\right) \cdot Vin, n - 1\%$$

Next, the second accumulation phase begins. During this phase, the control signal Ø1 is deasserted (so the control signal !Ø1 is asserted), closing switch S14, coupling voltage VBst to node Nd12. Concurrently, the control signal Ø2 is asserted (so the control signal !Ø2 is deasserted), closing switches S13 and S15. This results in capacitor C12 accumulating the voltage difference between VBst and Vbias via node Nd12. The voltage VBst at switch S11 is not connected in this phase because switch S11 is opened due to the control signal !Ø2 being deasserted.

By the end of this second accumulation phase, the output voltage VOUT1 can be derived from the relationship:

$$Cf \cdot (Voffset - VOUT1, n-1) + C2 \cdot Voffset =$$
$$C2 \cdot (Voffset - Vin, n) + Cf \cdot (Voffset - VOUT1, n)\%$$

This can be rearranged to yield:

$$VOUT1, n = \left(-\frac{C2}{Cf}\right) \cdot Vin, n + VOUT1, n-1\%$$

Substituting in the value of VOUT1, n−1 from the previous phase yields:

$$VOUT1, n = \left(-\frac{C1}{Cf}\right) \cdot Vin, n-1 + \left(-\frac{C2}{Cf}\right) \cdot Vin, n\%$$

Note therefore that the result is that the offset Voffset has been canceled from VOUT1 through the accumulation phases. This design may be adapted to use a fully differential amplifier 311.

Finally, it is evident that modifications and variations can be made to what has been described and illustrated herein without departing from the scope of this disclosure.

Although this disclosure has been described with a limited number of embodiments, those skilled in the art, having the benefit of this disclosure, can envision other embodiments that do not deviate from the disclosed scope. Furthermore, skilled persons can envision embodiments that represent various combinations of the embodiments disclosed herein made in various ways.

The invention claimed is:

1. A system for measuring a current, comprising:
an input inductor through which an input current flows;
a self-test inductor through which a self-test current flows;
a Hall effect sensor circuit configured to sense magnetic fields around the input inductor and the self-test inductor and to produce differential voltages based thereupon;
an input and self-test extraction circuit coupled to receive the differential voltages from the Hall effect sensor circuit and configured to alternatingly output a differential voltage indicative of a magnetic field around the input inductor and a magnetic field around the self-test inductor;
an amplifier configured to amplify the differential voltages output by the input and self-test extraction circuit;
a first sample/hold circuit configured to sample the differential voltages by the amplifier when the differential voltages are indicative of the magnetic field around the self-test inductor;
a second sample/hold circuit configured to sample the differential voltages by the amplifier when the differential voltages are indicative of the magnetic field around the input inductor; and
an integrator circuit configured to adjust a voltage applied to power supply inputs of the Hall effect sensor circuit based on an error between the differential voltage sampled by the first sample/hold circuit and a reference differential voltage so that a gain applied to the differential voltage sampled by the second sample/hold circuit is independent of a sensitivity of the Hall effect sensor circuit.

2. The system of claim 1, wherein:
the Hall effect sensor circuit comprises first, second, third, and fourth Hall effect sensors, each being differently physically oriented so as to be responsive to different orientations of the magnetic field around the self-test inductor and the magnetic field around the input inductor; and
the input and self-test extraction circuit is configured to combine outputs of the first, second, third, and fourth Hall effect sensors in specific configurations to alternately represent the magnetic field around the self-test inductor and the magnetic field around the input inductor.

3. The system of claim 2, wherein:
the first Hall effect sensor is physically oriented such that it is influenced by the magnetic field around the input inductor as directed out of plane, the magnetic field around the self-test inductor as directed into the plane, and an earth magnetic field as directed into the plane;
the second Hall effect sensor is physically oriented such that it is influenced by the magnetic field around the input inductor as directed out of the plane, the magnetic field around the self-test inductor as directed out of the plane, and an earth magnetic field as directed into the plane;
the third Hall effect sensor is physically oriented such that it is influenced by the magnetic field around the input inductor as directed into the plane, the magnetic field around the self-test inductor as directed into the plane, and an earth magnetic field as directed into the plane; and
the fourth Hall effect sensor is physically oriented such that it is influenced by the magnetic field around the input inductor as directed into the plane, the magnetic field around the self-test inductor as directed into the plane, and an earth magnetic field as directed out of the plane.

4. The system of claim 2, wherein:
to add outputs of two selected ones of the Hall effect sensors from among first, second, third, and fourth Hall effect sensors, positive outputs of those two selected Hall effect sensors are connected to one another and negative outputs of the two Hall effect sensors are connected to one another; and
to subtract the output of a first selected one of the first, second, third, and fourth Hall effect sensors from a second selected one of the first, second, third, and fourth Hall effect sensors, the positive output of the first selected Hall effect sensor is connected to the negative output of the second selected Hall effect sensor, and the negative output of the first selected Hall effect sensor is connected to the positive output of the second selected Hall effect sensor.

5. The system of claim 4, wherein:
the input and self-test extraction circuit, to output the differential voltage representative of the magnetic field surrounding the self-test inductor, is configured to:
connect the positive output of the second Hall effect sensor to the positive output of the fourth Hall effect sensor,
connect the negative output of the second Hall effect sensor to the negative output of the fourth Hall effect sensor,
connect the positive output of the first Hall effect sensor to the negative output of the third Hall effect sensor, and
connect the negative output of the first Hall effect sensor to the positive output of the third Hall effect sensor; and
the input and self-test extraction circuit, to output the differential voltage representative of the magnetic field surrounding the input inductor, is configured to:

connect the positive output of the first Hall effect sensor to the positive output of the second Hall effect sensor, connect the negative output of the first Hall effect sensor to the negative output of the second Hall effect sensor, connect the positive output of the third Hall effect sensor to the negative output of the fourth Hall effect sensor, and connect the negative output of the third Hall effect sensor to the positive output of the fourth Hall effect sensor.

6. The system of claim 1, further comprising a low-pass filter configured to filter the differential voltage sampled by the second sample/hold circuit.

7. The system of claim 6, wherein a filter output voltage generated by the low-pass filter is defined by a proportion between the differential voltage sampled by the second sample/hold circuit and the differential voltage sampled by the first sample/hold circuit, scaled by the reference differential voltage.

8. The system of claim 1, further comprising a signal accumulator coupled between outputs of the amplifier and inputs of the second sample/hold circuit, the signal accumulator configured to accumulate the sampled voltage indicative of the magnetic field around the input inductor.

9. The system of claim 8, wherein the signal accumulator comprises:
an amplifier having a non-inverting input connected to a bias voltage and an inverting input connected to a node;
a first switch connected between the voltage representing the magnetic field about the input inductor and a first node, the first switch controlled by a complement of a second control signal;
a first capacitor having a first terminal connected to the first node;
a second switch connected between a second terminal of the first capacitor and the node, the second switch controlled by a first control signal;
a third switch connected between the first node and the bias voltage, the third switch controlled by the second control signal;
a fourth switch connected between the voltage representing the magnetic field about the input inductor and a second node, the fourth switch controlled by a complement of the first control signal;
a second capacitor having a first terminal connected to the second node;
a fifth switch connected between the second terminal of the second capacitor and the node, the fifth switch controlled by the second control signal;
a sixth switch connected between the second node and the bias voltage, the sixth switch controlled by the first control signal;
a feedback capacitor connected between the node and a third node;
a seventh switch connected between the third node and an output of the amplifier, the seventh switch controlled by a complement of a reset signal;
an eighth switch connected between the third node and the bias voltage, the eighth switch controlled by the reset signal;
a ninth switch connected between the node and the output of the amplifier.

10. The system of claim 9, wherein during a reset phase, the reset signal is asserted, the first control signal is asserted, and the second control signal is asserted, thereby:
closing the second and third switches to discharge the first capacitor;
closing the fifth and sixth switches to discharge the second capacitor;
closing the eighth switch to discharge the feedback capacitor; and
connecting the inverting input of the amplifier to the output of the amplifier to zero the amplifier.

11. The system of claim 10, wherein during a first accumulation phase, the reset signal is deasserted, the first control is asserted and the second control signal is deasserted, thereby:
closing the seventh switch to connect the feedback capacitor between the inverting input and the output of the amplifier; and
closing the first and second switches to charge the first capacitor to a difference between the voltage representing the magnetic field about the input inductor and the bias voltage.

12. The system of claim 11, wherein during a second accumulation phase, the reset signal is deasserted, the first control signal is deasserted, and the second control signal is asserted, thereby:
closing the seventh switch to connect the feedback capacitor between the inverting input and the output of the amplifier; and
closing the fourth and fifth switches to charge the second capacitor to a difference between the voltage representing the magnetic field about the input inductor and the bias voltage.

13. The system of claim 1, further comprising a reference accumulator coupled between outputs of the amplifier and inputs of the first sample/hold circuit, the reference accumulator configured to accumulate the sampled voltage indicative of the magnetic field around the self-test inductor.

14. The system of claim 13, wherein the reference accumulator comprises:
an amplifier having a non-inverting input connected to a bias voltage and an inverting input connected to a node;
a first switch connected between the voltage representing the magnetic field about the self-test inductor and a first node, the first switch controlled by a complement of a second control signal;
a first capacitor having a first terminal connected to the first node;
a second switch connected between a second terminal of the first capacitor and the node, the second switch controlled by a first control signal;
a third switch connected between the first node and the bias voltage, the third switch controlled by the second control signal;
a fourth switch connected between the voltage representing the magnetic field about the input inductor and a second node, the fourth switch controlled by a complement of the first control signal;
a second capacitor having a first terminal connected to the second node;
a fifth switch connected between the second terminal of the second capacitor and the node, the fifth switch controlled by the second control signal;
a sixth switch connected between the second node and the bias voltage, the sixth switch controlled by the first control signal;
a feedback capacitor connected between the node and a third node;

a seventh switch connected between the third node and an output of the amplifier, the seventh switch controlled by a complement of a reset signal;

an eighth switch connected between the third node and the bias voltage, the eighth switch controlled by the reset signal;

a ninth switch connected between the node and the output of the amplifier.

15. The system of claim 14, wherein during a reset phase, the reset signal is asserted,
the first control signal is asserted, and the second control signal is asserted, thereby:
closing the second and third switches to discharge the first capacitor:
closing the fifth and sixth switches to discharge the second capacitor;
closing the eighth switch to discharge the feedback capacitor; and
connecting the inverting input of the amplifier to the output of the amplifier to zero the amplifier.

16. The system of claim 15, wherein during a first accumulation phase, the reset signal is deasserted, the first control is asserted and the second control signal is deasserted, thereby:
closing the seventh switch to connect the feedback capacitor between the inverting input and the output of the amplifier; and
closing the first and second switches to charge the first capacitor to a difference between the voltage representing the magnetic field about the self-test inductor and the bias voltage.

17. The system of claim 16, wherein during a second accumulation phase, the reset signal is deasserted, the first control signal is deasserted, and the second control signal is asserted, thereby:
closing the seventh switch to connect the feedback capacitor between the inverting input and the output of the amplifier; and
closing the fourth and fifth switches to charge the second capacitor to a difference between the voltage representing the magnetic field about the self-test inductor and the bias voltage.

18. A method for measuring a current using a system, the method comprising:
passing an input current through an input inductor;
passing a self-test current through a self-test inductor;
sensing magnetic fields around the input inductor and the self-test inductor using a Hall effect sensor circuit and producing differential voltage outputs based on the sensed magnetic fields;
receiving the differential voltage outputs from said Hall effect sensor circuit with an input and self-test extraction circuit, and alternatingly outputting a differential voltage representing either a magnetic field around the input inductor or a magnetic field around the self-test inductor;
amplifying the differential voltage output by the input and self-test extraction circuit using an amplifier;
sampling the amplified differential voltage with a first sample/hold circuit when the differential voltage indicates the magnetic field around the self-test inductor;
sampling the amplified differential voltage with a second sample/hold circuit when the differential voltage indicates the magnetic field around the input inductor; and
adjusting a voltage applied to power supply inputs of the Hall effect sensor circuit with an integrator circuit based on an error between the differential voltage sampled by the first sample/hold circuit and a reference differential voltage, such that a gain applied to the differential voltage sampled by the second sample/hold circuit is independent of a sensitivity of the Hall effect sensor circuit.

19. The method of claim 18, wherein:
sensing the magnetic fields comprises using first, second, third, and fourth Hall effect sensors, each being physically oriented so as to be responsive to different orientations of the magnetic field around the self-test inductor and the magnetic field around the input inductor; and
receiving the differential voltage outputs and alternatingly outputting a differential voltage includes combining outputs of the first, second, third, and fourth Hall effect sensors in specific configurations to alternately represent the magnetic field around the self-test inductor and the magnetic field around the input inductor.

20. The method of claim 19, wherein:
the first Hall effect sensor is oriented such that it senses the magnetic field around the input inductor as directed out of plane, the magnetic field around the self-test inductor as directed into the plane, and an earth magnetic field as directed into the plane;
the second Hall effect sensor is oriented such that it senses the magnetic field around the input inductor as directed out of the plane, the magnetic field around the self-test inductor as directed out of the plane, and an earth magnetic field as directed into the plane;
the third Hall effect sensor is oriented such that it senses the magnetic field around the input inductor as directed into the plane, the magnetic field around the self-test inductor as directed into the plane, and an earth magnetic field as directed into the plane; and
the fourth Hall effect sensor is oriented such that it senses the magnetic field around the input inductor as directed into the plane, the magnetic field around the self-test inductor as directed into the plane, and an earth magnetic field as directed out of the plane.

21. The method of claim 19, wherein:
to add outputs of two selected ones of the Hall effect sensors from among the first, second, third, and fourth Hall effect sensors, positive outputs of those two selected Hall effect sensors are combined, and negative outputs of the two Hall effect sensors are combined; and
to determine a difference between the output of a first selected one of the first, second, third, and fourth Hall effect sensors and a second selected one of the first, second, third, and fourth Hall effect sensors, the positive output of the first selected Hall effect sensor is combined with the negative output of the second selected Hall effect sensor, and the negative output of the first selected Hall effect sensor is combined with the positive output of the second selected Hall effect sensor.

22. The method of claim 21, wherein:
to produce the differential voltage indicative of the magnetic field surrounding the self-test inductor, the method includes: combining the positive output of the second Hall effect sensor with the positive output of the fourth Hall effect sensor, combining the negative output of the second Hall effect sensor with the negative output of the fourth Hall effect sensor, combining the positive output of the first Hall effect sensor with the negative output of the third Hall effect sensor, and combining the negative output of the first Hall effect sensor with the positive output of the third Hall effect sensor; and to produce the differential voltage indicative of the magnetic field surrounding the input inductor, the method includes: combining the positive output of the first Hall effect sensor with the positive output of the second Hall effect sensor, combining the negative output of the first Hall effect sensor with the negative output of the second Hall effect sensor, combining the positive output of the third Hall effect sensor with the negative output of the fourth Hall effect sensor, and combining the negative output of the third Hall effect sensor with the positive output of the fourth Hall effect sensor.

\* \* \* \* \*